(12) United States Patent
Kohno

(10) Patent No.: US 7,248,520 B2
(45) Date of Patent: Jul. 24, 2007

(54) SEMICONDUCTOR MEMORY AND DATA READ METHOD OF THE SAME

(75) Inventor: Fumihiro Kohno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/297,380

(22) Filed: Dec. 9, 2005

(65) Prior Publication Data
US 2006/0203583 A1 Sep. 14, 2006

(30) Foreign Application Priority Data
Mar. 9, 2005 (JP) ............................. 2005-065376

(51) Int. Cl.
*G11C 7/00* (2006.01)
(52) U.S. Cl. .................. 365/203; 365/230.06
(58) Field of Classification Search ................. 365/203
See application file for complete search history.

(56) References Cited

U.S. PATENT DOCUMENTS

| | | | | |
|---|---|---|---|---|
| 5,295,099 A | * | 3/1994 | Kagami ................. | 365/189.06 |
| 5,836,007 A | | 11/1998 | Clinton et al. | |
| 5,946,251 A | * | 8/1999 | Sato et al. ................. | 365/203 |
| 5,966,319 A | * | 10/1999 | Sato ........................ | 365/154 |
| 6,366,492 B1 | * | 4/2002 | Kawasumi ................ | 365/154 |
| 6,898,100 B2 | | 5/2005 | Kohno | |

FOREIGN PATENT DOCUMENTS

JP 11-53886 2/1999

* cited by examiner

*Primary Examiner*—Amir Zarabian
*Assistant Examiner*—Anthan Tran
(74) *Attorney, Agent, or Firm*—Oblon, Spivak, McClelland, Maier & Neustadt, P.C.

(57) ABSTRACT

A semiconductor memory having memory cells each storing first data and second data in a memory cell array arranged in a column direction; a plurality of word lines connected to the memory cells in a row direction; and first and second bit lines, to which the first and second data are respectively read out, in the column direction. When one of the first and second bit lines changes from a first potential to a second potential lower than the first potential after data read out, the potential of the other bit line is changed from the second to the first potential, and if the electric potential of the selected bit line changes from the first to the second potential when data is read out, the other bit line is selected when the data is next read out, and, if the electric potential of the selected bit line maintains the first potential, the selected bit line is maintained selected even when the data is to be read out next.

15 Claims, 8 Drawing Sheets

SEMICONDUCTOR MEMORY AND DATA READ METHOD OF THE SAME

CROSS REFERENCE TO RELATED APPLICATION

This application is based upon and claims benefit of priority under 35 USC § 119 from the Japanese Patent Application No. 2005-65376, filed on Mar. 9, 2005, the entire contents of which are incorporated herein by reference.

BACKGROUND OF THE INVENTION

The present invention relates to a semiconductor memory and a data read method of the same.

With the recent development of high-performance LSIs, it is being required to increase the operation speed of SRAMs incorporated into these LSIs.

An SRAM has memory cells arranged in a matrix. Each memory cell is connected to a word line running in the row direction, and is also connected to a pair of bit lines running along the column direction. The memory cell stores a pair of data.

To read out data from the memory cell, the pair of bit lines are charged in advance (i.e., precharged) to change their electric potentials to "H" level.

When the word line is activated by changing its electric potential to "H" level, the two data held in the memory cell are read out to the pair of bit lines.

A bit line to which data "0" is read out is discharged from "H" level to "L" level. A bit line to which data "1" is read out maintains "H" level without being discharged.

After that, signals corresponding to the potential levels detected from these bit lines are output, thereby reading out the data held in the memory cell.

When the data are thus read out from the memory cell, the electric potential of the word line is changed to "L" level, and the bit line whose electric potential has changed to "L" level is charged. In this manner, the electric potentials of both the pair of bit lines are set at "H" level.

As described above, a time for charging a bit line must be ensured after data are read out from a memory cell as an object of data read and before data are read out from a memory cell as an object of next data read. This makes it impossible to increase the operation speed of an SRAM.

Also, whenever data are read out from a memory cell, a bit line whose electric potential has changed to "L" level must be charged. This increases the power consumption.

SUMMARY OF THE INVENTION

According to one aspect of the present invention, there is provided a semiconductor memory comprising:

a memory cell array in which a plurality of memory cells each holding data made up of first data and second data are arranged at least along a column direction;

a plurality of word lines running along a row direction in said memory cell array, and connected to said memory cells;

a first bit line which runs along the column direction in said memory cell array and is connected to said memory cells, and to which the first data is read out from said memory cell when the data is read out from said memory cell;

a second bit line which runs along the column direction in said memory cell array and is connected to said memory cells, and to which the second data is read out from said memory cell when the data is read out from said memory cell;

a bit line precharge unit which, when detecting that an electric potential of one of said first and second bit lines changes from a first potential to a second potential lower than the first potential after the data is read out from said memory cell, changes an electric potential of the other bit line from the second potential to the first potential; and a bit line selector which, if the electric potential of the selected one of said first and second bit lines changes from the first potential to the second potential when the data is read out, selects the other bit line when the data is to be read out next, and, if the electric potential of the selected one of said first and second bit lines maintains the first potential, keeps selecting the selected bit line even when the data is to be read out next.

According to one aspect of the present invention, there is provided a data read method of a semiconductor memory, wherein, when reading out data from a semiconductor memory comprising:

a memory cell array in which a plurality of memory cells each holding data made up of first data and second data are arranged at least along a column direction;

a plurality of word lines running along a row direction in the memory cell array, and connected to the memory cells;

a first bit line which runs along the column direction in the memory cell array and is connected to the memory cells, and to which the first data is read out from the memory cell when the data is read out from the memory cell; and a second bit line which runs along the column direction in the memory cell array and is connected to the memory cells, and to which the second data is read out from the memory cell when the data is read out from the memory cell, the method comprises:

when detecting that an electric potential of one of the first and second bit lines changes from a first potential to a second potential lower than the first potential after the data is read out from the memory cell, changing an electric potential of the other bit line from the second potential to the first potential;

if the electric potential of the selected one of the first and second bit lines changes from the first potential to the second potential when the data is read out, selecting the other bit line when the data is to be read out next, and, if the electric potential of the selected one of the first and second bit lines maintains the first potential, keeping selecting the selected bit line even when the data is to be read out next; and reading out the first or second data from one or the other bit line selected.

DETAILED DESCRIPTION OF THE INVENTION

An embodiment of the present invention will be described below with reference to the accompanying drawing.

Figure 1:
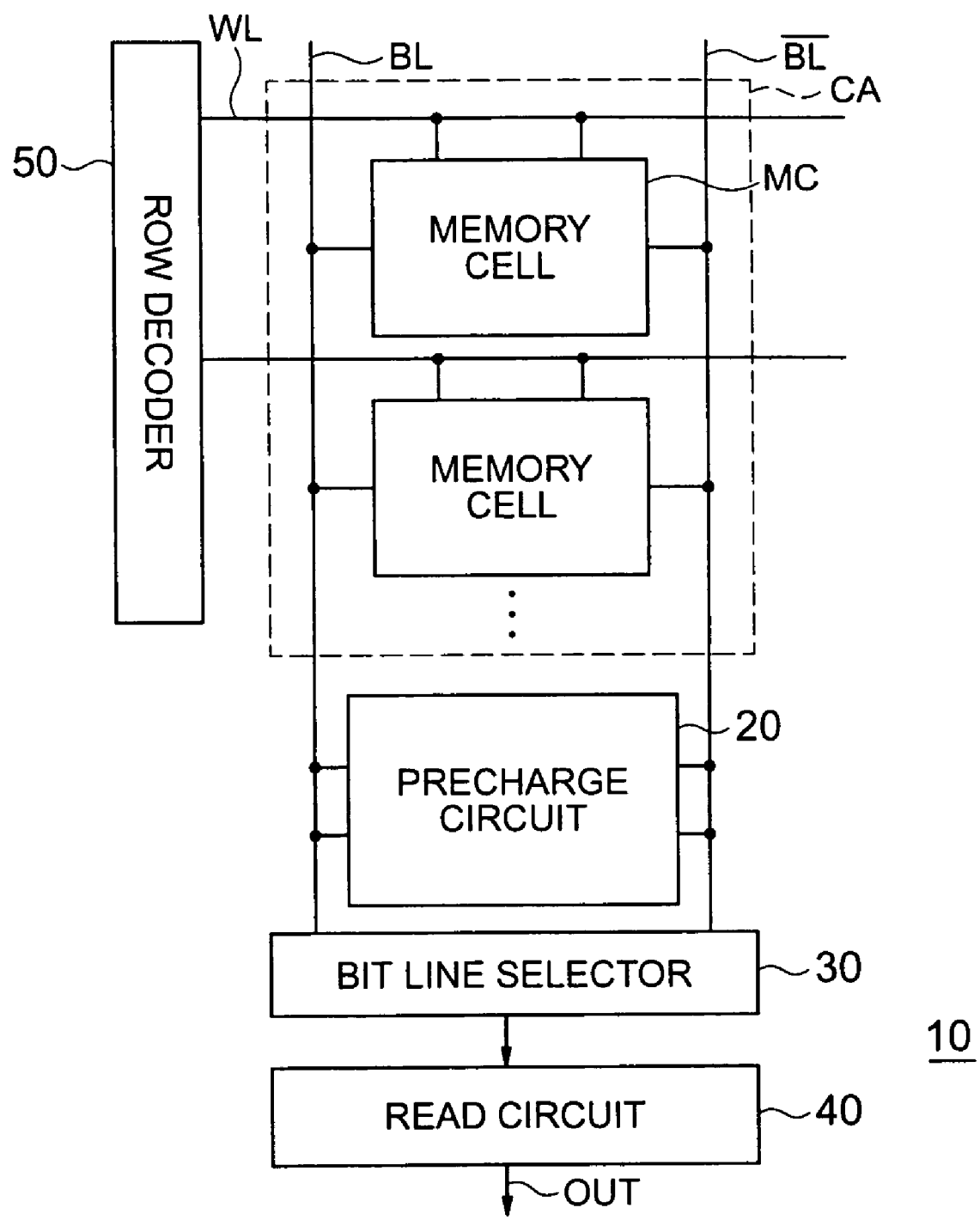
FIG. 1 is a block diagram showing the arrangement of an SRAM according to an embodiment of the present invention.

FIG. 1 shows the arrangement of an SRAM 10 according to the embodiment of the present invention. In a memory cell array CA of the SRAM 10, memory cells MC are arranged in a matrix. Each memory cell MC is connected to a word line WL running in the row direction, and is also connected to a pair of bit lines BL and /BL running in the column direction. In this embodiment, the bit lines BL and /BL are read bit lines. Write bit lines (not shown) are separately formed to prevent destruction of data in the memory cells MC during data read. The memory cells MC need only be arranged at least along the column direction.

Figure 2:
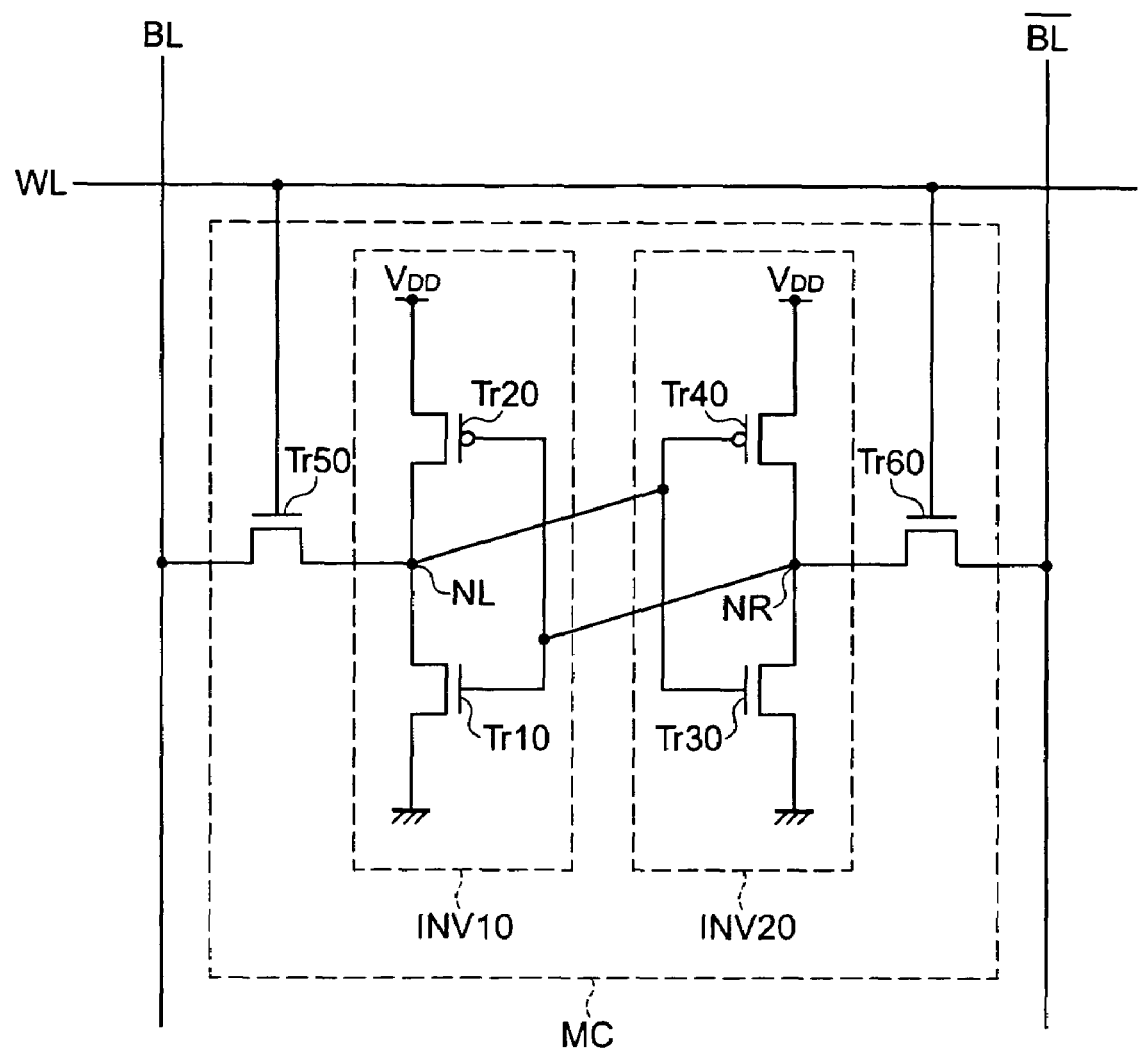
FIG. 2 is a circuit diagram showing the arrangement of a memory cell of the SRAM.

As shown in FIG. 2, the memory cell MC is, e.g., a so-called full CMOS memory cell, and includes CMOS inverters (to be referred to as inverters hereinafter) INV10 and INV20 and transistors Tr50 and Tr60.

The inverter INV10 is formed by connecting the drain of an NMOS transistor Tr10 to the drain of a PMOS transistor Tr20, connecting the source of the NMOS transistor Tr10 to a ground GND, and connecting the source of the PMOS transistor Tr20 to a power supply terminal $V_{DD}$.

Similar to the inverter INV10, the inverter INV20 is formed by connecting the drain of an NMOS transistor Tr30 to the drain of a PMOS transistor Tr40, connecting the source of the NMOS transistor Tr30 to the ground GND, and connecting the source of the PMOS transistor Tr40 to the power supply terminal $V_{DD}$.

A left node NL as a connecting point between the drain of the NMOS transistor Tr10 and the drain of the PMOS transistor Tr20 is connected to the gate of the NMOS transistor Tr30 and the gate of the PMOS transistor Tr40, and is also connected to one end of the transistor Tr50. The other end of the transistor Tr50 is connected to the read bit line BL. The gate of the transistor Tr50 is connected to the word line WL.

A right node NR as a connecting point between the drain of the NMOS transistor Tr30 and the drain of the PMOS transistor Tr40 is connected to the gate of the NMOS transistor Tr10 and the gate of the PMOS transistor Tr20, and is also connected to one end of the transistor Tr60. The other end of the transistor Tr60 is connected to the read bit line /BL. The gate of the transistor Tr60 is connected to the word line WL.

To write data in the memory cell MC, the electric potential of the word line WL is changed to "H" level to turn on two write transistors corresponding to the transistors Tr50 and Tr60.

In this case, if the electric potential of a write bit line (not shown) adjacent to the bit line BL is changed to "H" level and the electric potential of a write bit line (not shown) adjacent to the bit line /BL is changed to "L" level, the NMOS transistor Tr10 is turned off, the PMOS transistor Tr20 is turned on, the NMOS transistor Tr30 is turned on, and the PMOS transistor Tr40 is turned off.

Consequently, the left node NL is connected to the power supply terminal $V_{DD}$ via the PMOS transistor Tr20, and the right node NR is connected to the ground GND via the NMOS transistor Tr30.

In this way, data "1" is written in the left node NL of the memory cell MC, and data "0" is written in the right node NR of the memory cell MC, thereby writing data "1" in the memory cell MC.

On the other hand, if the electric potential of the write bit line (not shown) adjacent to the bit line BL is changed to "L" level and the electric potential of the write bit line (not shown) adjacent to the bit line /BL is changed to "H" level, the NMOS transistor Tr10 is turned on, the PMOS transistor Tr20 is turned off, the NMOS transistor Tr30 is turned off, and the PMOS transistor Tr40 is turned on.

Consequently, the left node NL is connected to the ground GND via the NMOS transistor Tr10, and the right node NR is connected to the power supply terminal $V_{DD}$ via the PMOS transistor Tr40.

In this way, data "0" is written in the left node NL of the memory cell MC, and data "1" is written in the right node NR of the memory cell MC, thereby writing data "0" in the memory cell MC.

Then, the electric potential of the word line WL is changed to "L" level, and the two write transistors corresponding to the transistors Tr50 and Tr60 are turned off, thereby holding the data written in the left node NL and right node NR.

In this embodiment, to read out data from the memory cell MC, data is not read out from both the bit lines BL and /BL, but one of the bit lines BL and /BL is selected, and data is read out only from this selected bit line.

On the assumption that the electric potential of a selected bit line for data read is at "H" level, data read is performed by checking whether the electric potential of this read bit line changes from "H" level to "L" level when the electric potential of the word line WL is changed to "H" level to turn on the transistors Tr50 and Tr60.

A read operation when, e.g., the bit line BL is selected as a read bit line will be explained below.

If data "0" is written in the node NL of the memory cell MC, the electric potential of the word line WL is changed to "H" level to turn on the transistor Tr50. Consequently, the bit line BL is discharged to the ground GND via the transistor Tr50 and NMOS transistor Tr10, and the electric potential of the bit line BL changes from "H" level to "L" level. Data "0" is read out by detecting this change in electric potential of the bit line BL.

If data "1" is written in the node NL, the electric potential of the word line WL is changed to "H" level to turn on the transistor Tr50. As a consequence, the bit line BL and the power supply terminal $V_{DD}$ of the inverter INV10 are electrically connected. Since, however, the electric potential of the bit line BL is the same as the electric potential of the power supply terminal $V_{DD}$, the bit line BL is not discharged, so its electric potential maintains "H" level. Data "1" is read out by detecting this electric potential of the bit line BL.

Note that a read operation when the bit line /BL is selected as a read bit line is the same as that when the bit line BL is selected, so an explanation thereof will be omitted.

If a precharge circuit 20 detects that the electric potential of a read bit line changes from "H" level to "L" level while the electric potential of this read bit line is at "H" level and the electric potential of a non-read bit line is at "L" level, it charges (i.e., precharges) the non-read bit line to change, from "L" level to "H" level, the electric potential of a bit line to be selected when data is to be read out next.

If the electric potential of a selected bit line changes from "H" level to "L" level, a bit line selector 30 selects another bit line as a read bit line when data is to be read out next. If the electric potential of the former selected bit line maintains "H" level, the bit line selector 30 keeps selecting this bit line.

In this manner, the bit line selector 30 selects a read bit line when data is to be read out next, in accordance with the electric potential of a bit line currently being selected.

A read circuit 40 has a sense amplifier and the like, and amplifies the electric potential of a bit line selected by the bit line selector 30 to a predetermined level, thereby generating an output signal corresponding to the change in electric potential of the selected bit line, and outputting this output signal to the outside.

In data read or write, a row decoder 50 selects a word line WL to which a memory cell MC as an object of read or write is connected, and changes the electric potential of the selected word line WL to "H" level.

Figure 3:
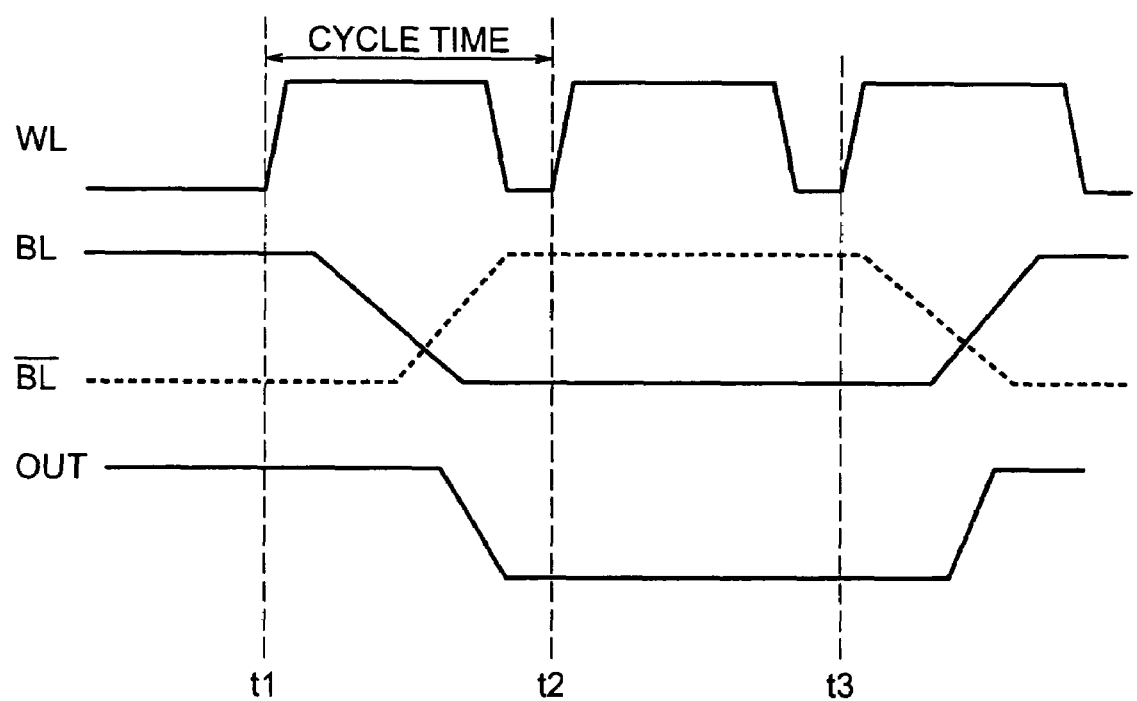
FIG. 3 is a timing chart showing the data read operation of the SRAM.

FIG. 3 shows an example of a timing chart showing the data read operation of the SRAM 10. As shown in FIG. 3, assume that the electric potential of the bit line BL is at "H" level, that the electric potential of the bit line /BL is at "L" level, and that data "1" is read out as an output signal OUT from the read circuit 40. If the electric potential of a desired word line WL is changed to "H" level, the bit line BL is discharged, so its electric potential changes from "H" level to "L" level (time t1 to time t2).

When the electric potential of the bit line BL becomes lower than a predetermined threshold value, the precharge circuit 20 detects that the electric potential of the bit line BL has changed from "H" level to "L" level, and charges the bit line /BL. As a consequence, the electric potential of the bit line /BL changes from "L" level to "H" level.

The output signal OUT from the read circuit 40 changes from data "1" to data "0" in accordance with the change in electric potential of the bit line BL selected by the bit line selector 30. After that, the electric potential of the word line WL is changed from "H" level to "L" level.

When the electric potential of a word line WL to which a memory cell MC as an object of next data read is connected is changed to "H" level, the bit line /BL is selected as a read bit line (time t2 to time t3).

Since the bit line /BL is not discharged, the electric potential of the bit line /BL maintains "H" level, so the output signal OUT maintains data "0". After that, the electric potential of this word line is changed from "H" level to "L" level.

The electric potential of a word line to which a memory cell MC as an object of next data read is connected is changed to "H" level (time t3). At this point, the bit line selector 30 keeps selecting the bit line /BL as a read bit line.

In this case, the bit line /BL is discharged, so its electric potential changes from "H" level to "L" level. Since the electric potential of the bit line /BL becomes lower than a predetermined threshold value, the precharge circuit 20 detects that the electric potential of the bit line /BL has changed from "H" level to "L" level, and charges the bit line BL. Consequence, the electric potential of the bit line BL changes from "L" level to "H" level.

The output signal OUT changes from data "0" to data "1" in accordance with the change in electric potential of the bit line /BL selected by the bit line selector 30. After that, the electric potential of the word line WL is changed from "H" level to "L" level.

Figure 4:
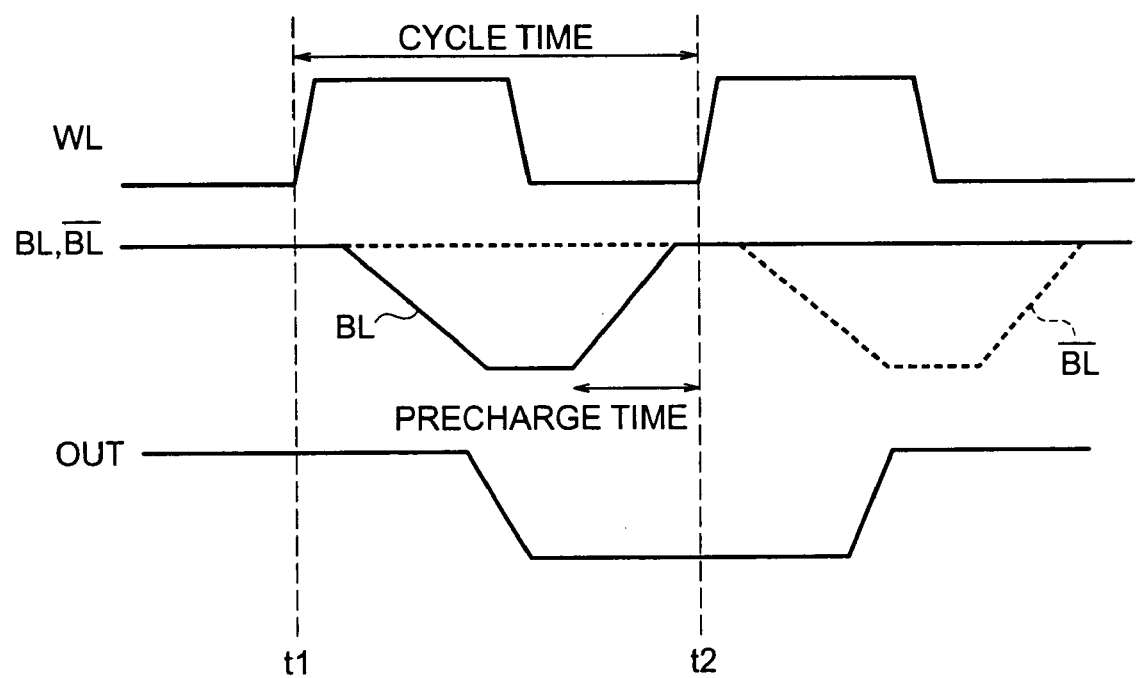
FIG. 4 is a timing chart showing the data read operation of a comparative example.

As a comparative example, FIG. 4 shows a timing chart when the electric potentials of both the bit lines BL and /BL are set at "H" level before the electric potential of a word line WL to which a memory cell MC as an object of data read is connected is changed to "H" level, and data is read out by detecting whether the electric potential of each of the bit lines BL and /BL changes from "H" level to "L" level.

In this comparative example, it is necessary, during a cycle time, to ensure a precharge time for charging the bit line BL whose electric potential has changed to "L" level, thereby changing the electric potential of the bit line BL to "H" level.

Also, in this comparative example, one of the bit lines BL and /BL is discharged and charged whenever data read is performed. This increases the power consumption.

By contrast, in this embodiment, while data is read out from a bit line as an object of present data read, a bit line as an object of next data read is charged. This makes it unnecessary to separately ensure a precharge time during a cycle type. Accordingly, it is possible to shorten the cycle time and increase the data read speed.

Also, in this embodiment, if the electric potential of a read bit line maintains "H" level after data is read out from the memory cell MC to this read bit line, it is unnecessary to charge or discharge the bit lines BL and /BL, so the power consumption can be reduced accordingly.

Figure 5:
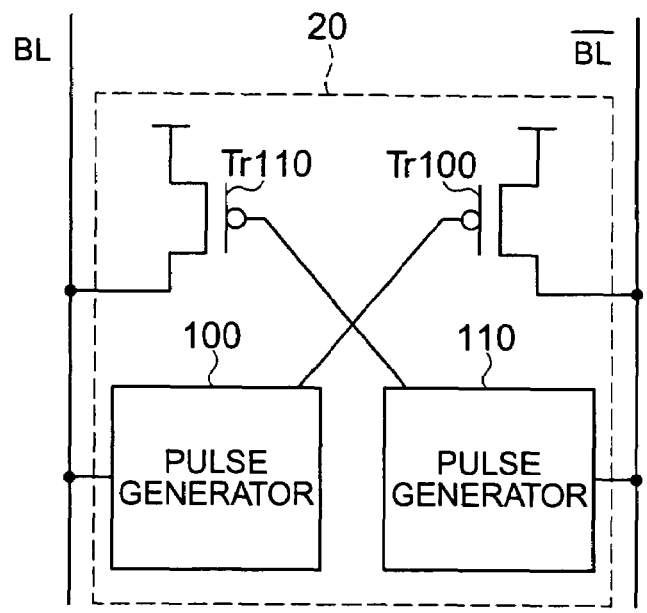
FIG. 5 is a block diagram showing the arrangement of a precharge circuit.

FIG. 5 shows the arrangement of the precharge circuit 20. The precharge circuit 20 includes pulse generators 100 and 110, and PMOS transistors Tr100 and Tr110.

The pulse generator 100 is connected to the bit line BL and to the gate of the PMOS transistor Tr100. The PMOS transistor Tr100 has one end connected to the power supply and the other end connected to the bit line /BL.

The pulse generator 110 is connected to the bit line /BL and to the gate of the PMOS transistor Tr110. The PMOS transistor Tr110 has one end connected to the power supply and the other end connected to the bit line BL.

Figure 6:
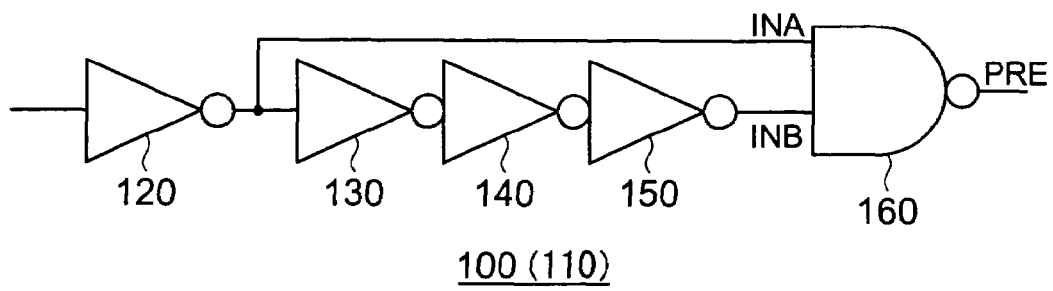
FIG. 6 is a circuit diagram showing the arrangement of a pulse generator.
Figure 7:
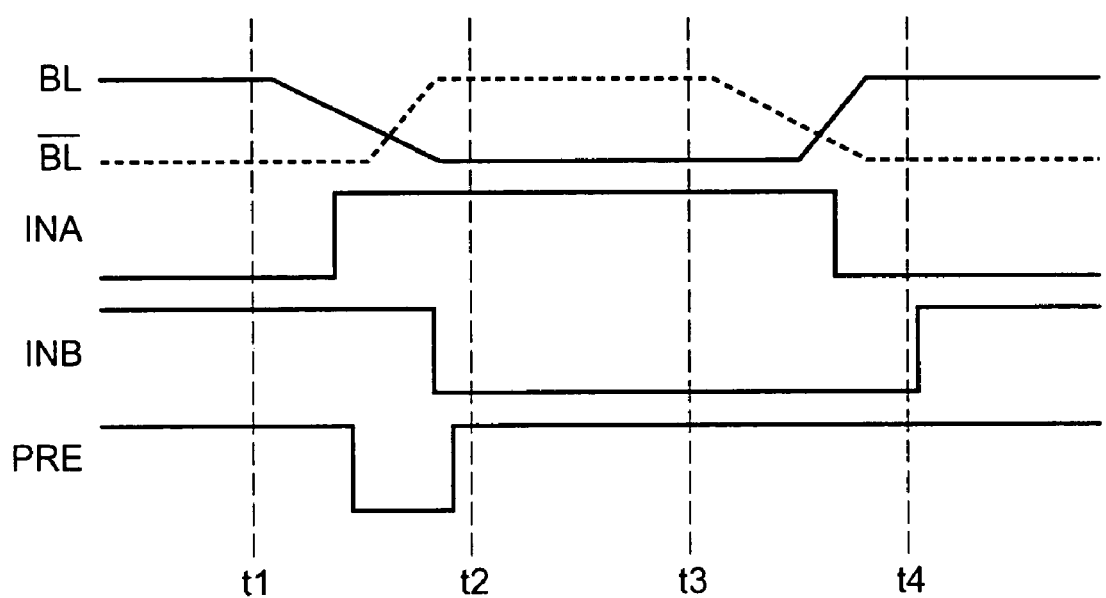
FIG. 7 is a timing chart showing the precharge operation of the pulse generator.

FIG. 6 shows the arrangement of the pulse generator 100. FIG. 7 shows an example of a timing chart of the precharge operation in the pulse generator 100. In a case in which the electric potential of the bit line BL is at "H" level and "L" level is output as an output signal INA, if the bit line BL is discharged and its electric potential becomes lower than a predetermined threshold value, an inverter 120 changes the output signal INA from "L" level to "H" level at the timing when the electric potential becomes lower than the threshold value, and outputs the signal to a NAND circuit 160 (time t1 to time t2).

Inverters 130 to 150 invert the potential level of the output signal INA and delay the signal by a predetermined time, thereby generating an output signal INB whose trailing edge lags behind the leading edge of the output signal INA by the predetermined time, and outputting the output signal INB to the NAND circuit 160 (time t1 to time t2).

The NAND circuit 160 generates a pulsed precharge signal PRE by NANDing the output signals INA and INB. The NAND circuit 160 outputs the precharge signal PRE to the gate of the PMOS transistor Tr100 to turn it on. In this manner, if the electric potential of the bit line BL changes from "H" level to "L" level, the NAND circuit 160 charges the bit line /BL for the period of a pulse width, thereby changing its electric potential from "L" level to "H" level (time t1 to time t2).

As described above, the precharge signal is pulsed to charge the bit line /BL only for a predetermined time. This avoids an event in which the bit line /BL is kept charged and, when data is to be read out next, a change in electric potential of the bit line /BL from "H" level to "L" level cannot be detected any longer.

Note that the pulse generator 110 also has the same arrangement as that of the pulse generator 100 and performs the same precharge operation as that of the pulse generator 100.

Figure 8:
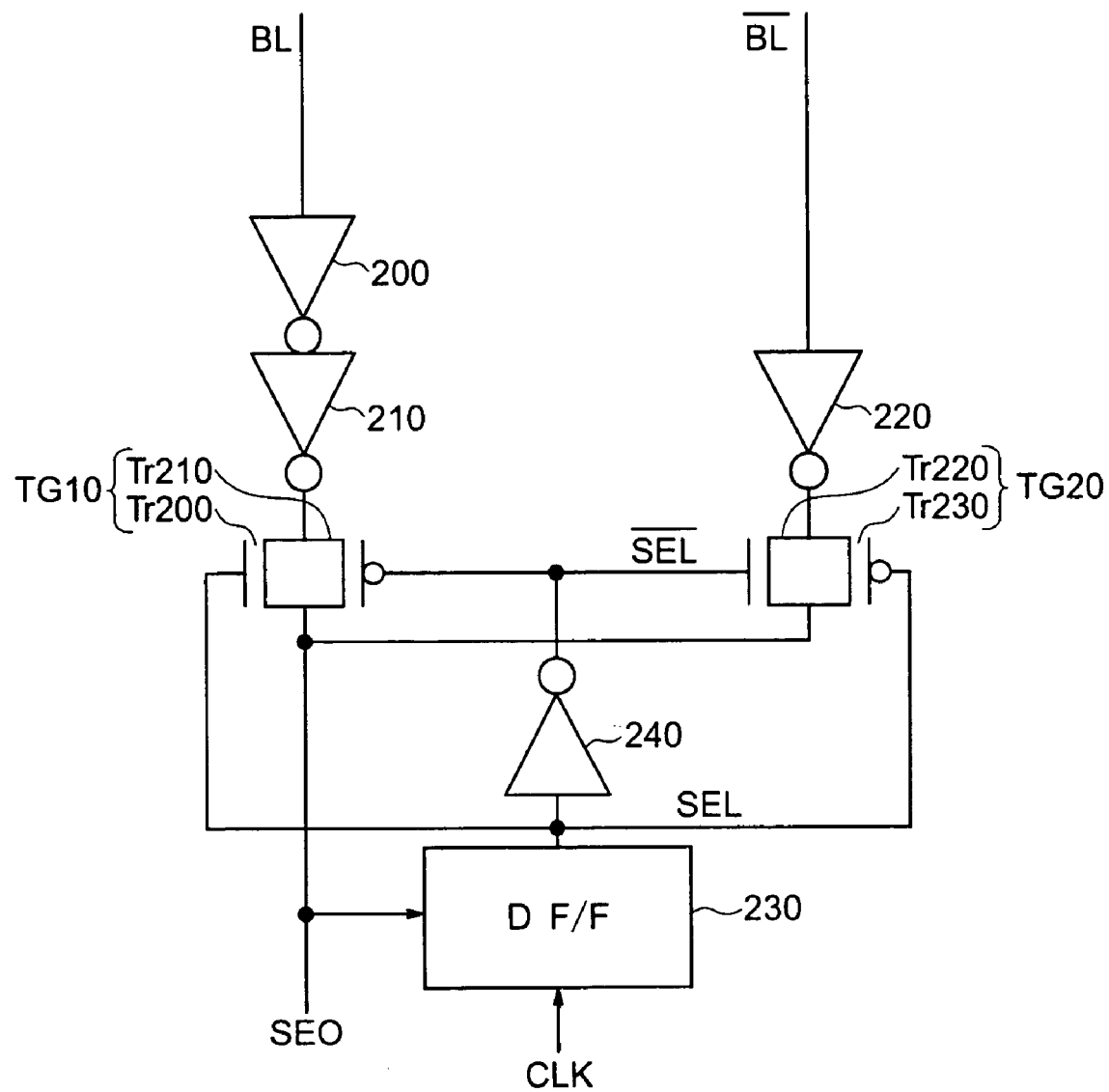
FIG. 8 is a block diagram showing the arrangement of a bit line selector.

FIG. 8 shows the arrangement of the bit line selector 30. The bit line BL is connected, via inverters 200 and 210, to the input terminal of a transfer gate TG10 in which an NMOS transistor Tr200 and PMOS transistor Tr210 are connected in parallel.

The bit line /BL is connected, via an inverter 220, to the input terminal of a transfer gate TG20 in which an NMOS transistor Tr220 and PMOS transistor Tr230 are connected in parallel.

The output terminal of the transfer gate TG10 is connected to the output terminal of the transfer gate TG20 and the input terminal of a D flip-flop 230. The output terminal of the D flip-flop 230 is connected to the gate of the NMOS transistor Tr200 and the gate of the PMOS transistor Tr230. The output terminal of the D flip-flop 230 is also connected, via an inverter 240, to the gate of the PMOS transistor Tr210 and the gate of the NMOS transistor Tr220.

The D flip-flop 230 stores the potential level of an output signal SEO at the supply timing of a clock signal CLK. Until the next supply timing of the clock signal CLK, the D flip-flop 230 outputs a select signal SEL corresponding to the stored potential level to the gates of the NMOS transistor Tr200 and PMOS transistor Tr230, and outputs a select signal /SEL as an inversion of the select signal SEL to the gates of the PMOS transistor Tr210 and NMOS transistor Tr220.

Figure 9:
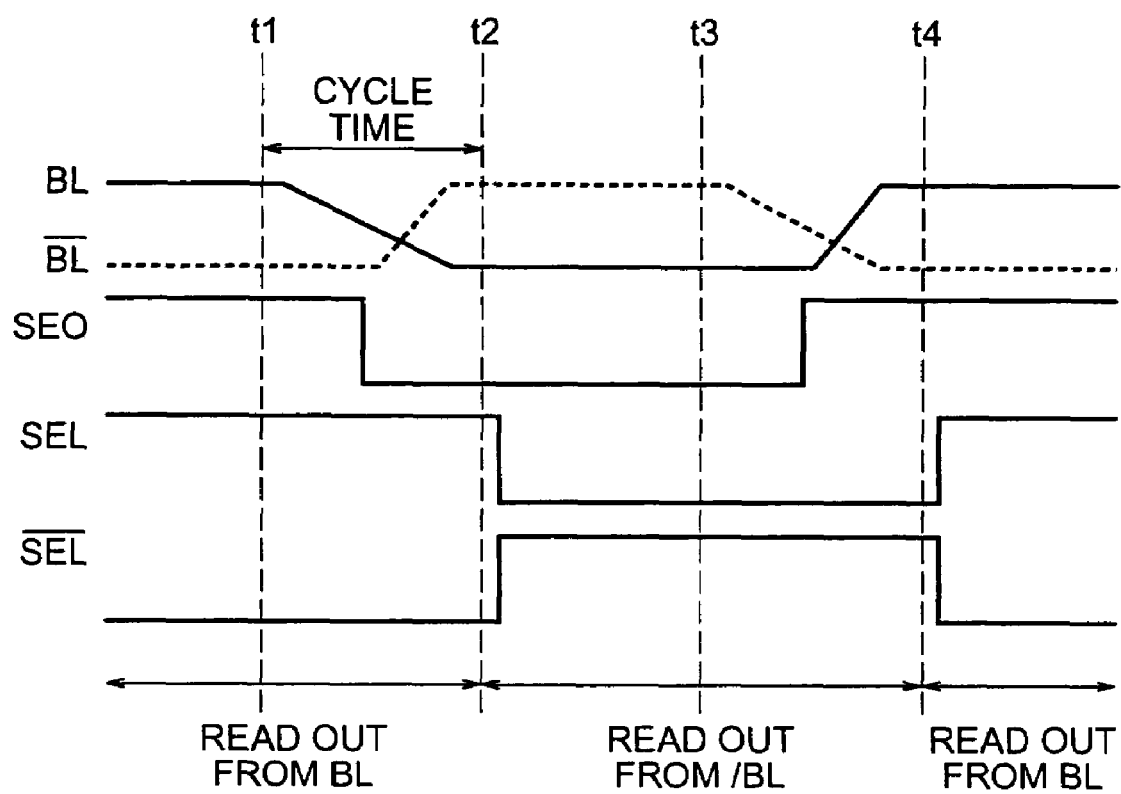
FIG. 9 is a timing chart showing the bit line selecting operation of the bit line selector.

FIG. 9 shows an example of a timing chart showing the bit line selecting operation of the bit line selector 30. First, when the select signal SEL is at "H" level and the select signal /SEL is at "L" level, the transfer gate TG10 is turned on to select the bit line BL as a read bit line.

If the electric potential of the bit line BL is at "H" level and that of the bit line /BL is at "L" level, "H" level is output as the output signal SEO of the bit line selector 30 (time t1).

In this state, if the bit line BL is discharged and its electric potential becomes lower than a predetermined threshold value, the output signal SEO changes from "H" level to "L" level at the timing at which the electric potential becomes lower than the threshold value (time t1 to time t2).

At the timing at which the clock signal CLK is supplied to the D flip-flop 230, the select signal SEL changes from "H" level to "L" level, and the select signal /SEL changes from "L" level to "H" level (time t2 to time t3).

As a consequence, the transfer gate TG20 is turned on to select the bit line /BL as the next read bit line, and data is read out from the bit line /BL (time t2 to time t3).

After that, if the bit line /BL is not discharged and its electric potential maintains "H" level, "L" level is output as the output signal SEO. Accordingly, the bit line selector 30 keeps selecting the bit line /BL as a read bit line when data is to be read out next (time t3 to time t4).

If the bit line /BL is discharged and its electric potential becomes lower than a predetermined threshold value, the output signal SEO changes from "L" level to "H" level at the timing at which the electric potential becomes lower than the threshold value (time t3 to time t4).

At the timing at which the clock signal CLK is supplied to the D flip-flop 230, the select signal SEL changes from "L" level to "H" level, and the select signal /SEL changes from "H" level to "L" level (time t4).

As a consequence, the transfer gate TG10 is turned on to select the bit line BL as the next read bit line, and data is read out from the bit line BL (time t4).

Note that the SRAM 10 of this embodiment is suitably used as, e.g., a cache memory of a CPU.

As has been explained above, the semiconductor memory and its data read method according to this embodiment can perform data read at high speed and reduce the power consumption.

Note that the above embodiment is merely an example and hence does not limit the present invention. For example, in the above embodiment, the electric potential of the bit line BL is preset at "H" level and that of the bit line /BL is preset at "L" level before data read is started. However, the potentials of both the bit lines BL and /BL may also be preset at "H" level. It is also possible to give bit lines a hierarchical structure by forming local bit lines for connecting the memory cells MC, and global bit lines for selecting a plurality of local bit lines as bit lines.

What is claimed is:

1. A semiconductor memory comprising:
    a memory cell array in which a plurality of memory cells each holding data made up of first data and second data are arranged at least along a column direction;
    a plurality of word lines running along a row direction in said memory cell array, and connected to said memory cells;
    a first bit line which runs along the column direction in said memory cell array and is connected to said memory cells, and to which the first data is read out from said memory cell when the data is read out from said memory cell;
    a second bit line which runs along the column direction in said memory cell array and is connected to said memory cells, and to which the second data is read out from said memory cell when the data is read out from said memory cell;
    a bit line precharge unit which, when detecting that an electric potential of one of said first and second bit lines changes from a first potential to a second potential lower than the first potential after the data is read out from said memory cell, changes an electric potential of the other bit line from the second potential to the first potential; and
    a bit line selector which, if the electric potential of the selected one of said first and second bit lines changes from the first potential to the second potential when the data is read out, selects the other bit line when the data is to be read out next, and, if the electric potential of the selected one of said first and second bit lines maintains the first potential, keeps selecting the selected bit line even when the data is to be read out next.

2. A memory according to claim 1, wherein said bit line precharge unit comprises:
    a first charging transistor having a source and drain connected between a power supply terminal and said first bit line;
    a second pulse generator which is connected between a gate of said first charging transistor and said second bit line, and, when detecting that the electric potential of said second bit line changes from the first potential to the second potential, generates a second precharge signal having a pulse with a predetermined width, and outputs the second precharge signal to the gate of said first charging transistor, thereby turning on said first charging transistor;

a second charging transistor having a source and drain connected between said power supply terminal and second bit line; and a first pulse generator which is connected between a gate of said second charging transistor and said first bit line, and, when detecting that the electric potential of said first bit line changes from the first potential to the second potential, generates a first precharge signal having a pulse with a predetermined width, and outputs the first precharge signal to the gate of said second charging transistor, thereby turning on said second charging transistor.

3. A memory according to claim 1, wherein said bit line selector comprises:

a selecting circuit which selects a desired one of said first and second bit lines in accordance with a select signal; and a delay circuit which generates the select signal by delaying, by a predetermined time, a signal corresponding to an electric potential of the bit line selected by said selecting circuit, and supplies the select signal to said selecting circuit.

4. A memory according to claim 2, wherein said bit line selector comprises:

a selecting circuit which selects a desired one of said first and second bit lines in accordance with a select signal; and a delay circuit which generates the select signal by delaying, by a predetermined time, a signal corresponding to an electric potential of the bit line selected by said selecting circuit, and supplies the select signal to said selecting circuit.

5. A memory according to claim 1, wherein when detecting that the electric potential of said selected bit line changes from the first potential to the second potential, said bit line precharge unit charges the other bit line to change the electric potential thereof from the second potential to the first potential.

6. A memory according to claim 1, wherein said bit line precharge unit charges the other bit line for a predetermined time.

7. A memory according to claim 1, further comprising a bit line read unit which generates and outputs an output signal corresponding to the electric potential of the bit line selected by said bit line selector by amplifying the electric potential of the selected bit line to a predetermined level.

8. A memory according to claim 1, further comprising a row decoder which, when the data is to be read out, selects a word line to which a memory cell as an object of data read is connected.

9. A data read method of a semiconductor memory, wherein, when reading out data from a semiconductor memory comprising:

a memory cell array in which a plurality of memory cells each holding data made up of first data and second data are arranged at least along a column direction;

a plurality of word lines running along a row direction in the memory cell array, and connected to the memory cells;

a first bit line which runs along the column direction in the memory cell array and is connected to the memory cells, and to which the first data is read out from the memory cell when the data is read out from the memory cell; and a second bit line which runs along the column direction in the memory cell array and is connected to the memory cells, and to which the second data is read out from the memory cell when the data is read out from the memory cell, the method comprises:

when detecting that an electric potential of one of the first and second bit lines changes from a first potential to a second potential lower than the first potential after the data is read out from the memory cell, changing an electric potential of the other bit line from the second potential to the first potential;

if the electric potential of the selected one of the first and second bit lines changes from the first potential to the second potential when the data is read out, selecting the other bit line when the data is to be read out next, and, if the electric potential of the selected one of the first and second bit lines maintains the first potential, keeping selecting the selected bit line even when the data is to be read out next; and reading out the first or second data from one or the other bit line selected.

10. A method according to claim 9, wherein when the electric potential of the other bit line is changed from the second potential to the first potential, when it is detected that the electric potential of the selected bit line changes from the first potential to the second potential, the other bit line is charged to change the electric potential thereof from the second potential to the first potential.

11. A method according to claim 9, wherein when the electric potential of the other bit line is changed from the second potential to the first potential, the other bit line is charged for a predetermined time.

12. A method according to claim 9, further comprising, generating and outputting an output signal corresponding to the electric potential of the selected bit line by amplifying the electric potential of the selected bit line to a predetermined level after changing the electric potential of the other bit line from the second potential to the first potential.

13. A method according to claim 10, further comprising, generating and outputting an output signal corresponding to the electric potential of the selected bit line by amplifying the electric potential of the selected bit line to a predetermined level after changing the electric potential of the other bit line from the second potential to the first potential.

14. A method according to claim 11, further comprising, generating and outputting an output signal corresponding to the electric potential of the selected bit line by amplifying the electric potential of the selected bit line to a predetermined level after changing the electric potential of the other bit line from the second potential to the first potential.

15. A method according to claim 9, further comprising, when the data is to be read out, selecting a word line to which a memory cell as an object of data read is connected.

* * * * *